(12) United States Patent
Konarski

(10) Patent No.: US 6,893,736 B2
(45) Date of Patent: May 17, 2005

(54) THERMOSETTING RESIN COMPOSITIONS USEFUL AS UNDERFILL SEALANTS

(75) Inventor: Mark M. Konarski, Old Saybrook, CT (US)

(73) Assignee: Henkel Corporation, Rocky Hill, CT (US)

( * ) Notice: Subject to any disclaimer, the term of this patent is extended or adjusted under 35 U.S.C. 154(b) by 113 days.

(21) Appl. No.: 10/294,668

(22) Filed: Nov. 15, 2002

(65) Prior Publication Data

US 2003/0131937 A1 Jul. 17, 2003

Related U.S. Application Data

(60) Provisional application No. 60/331,523, filed on Nov. 19, 2001.

(51) Int. Cl.$^7$ .............................................. H01L 29/12
(52) U.S. Cl. ....................... 428/620; 523/457; 523/458; 525/533; 528/92; 528/94; 528/109; 528/112; 528/407; 528/410; 528/412
(58) Field of Search .......................... 428/620; 523/457, 523/458, 459; 525/533; 528/92, 94, 109, 112, 407, 410, 412

(56) References Cited

U.S. PATENT DOCUMENTS

| 3,349,047 A | 10/1967 | Sheard ........................ 260/18 |
| 3,862,260 A | 1/1975 | Sellers et al. ................ 260/831 |
| 4,473,674 A | 9/1984 | Stoakley et al. ............. 523/454 |
| 4,499,245 A | 2/1985 | Ikeguchi et al. ............. 525/417 |
| 4,645,803 A | 2/1987 | Kohli et al. .................. 525/423 |
| 4,912,179 A | 3/1990 | Murakami et al. ........... 525/524 |
| 4,918,157 A | 4/1990 | Gardner et al. .............. 528/322 |
| 4,985,530 A | 1/1991 | Murakami et al. ........... 528/103 |
| 5,034,494 A | 7/1991 | Nakajima et al. ............. 528/94 |
| 5,091,474 A | 2/1992 | Murakami et al. ........... 525/109 |
| 5,128,424 A | 7/1992 | McGinnis et al. ........... 525/481 |
| 5,350,826 A | 9/1994 | Watanabe et al. ............. 528/93 |
| 5,434,225 A | 7/1995 | Mathes et al. ............... 525/525 |
| 5,503,936 A | 4/1996 | Blyakhman ................. 428/413 |
| 5,512,372 A | 4/1996 | Blanc et al. ................. 428/413 |
| 5,541,000 A | 7/1996 | Hardy et al. ................. 428/413 |
| 5,554,714 A | 9/1996 | Muroi et al. .................. 528/94 |
| 5,561,204 A | 10/1996 | Muroi et al. ................. 525/524 |
| 5,672,431 A | 9/1997 | Lin ............................. 428/413 |
| 5,780,555 A | 7/1998 | Corley et al. ................ 525/407 |
| 5,940,688 A | 8/1999 | Higuchi et al. .............. 428/127 |
| 5,969,036 A | 10/1999 | Dershem ..................... 524/779 |
| 6,214,904 B1 | 4/2001 | Tanaka et al. ............... 523/409 |
| 6,278,192 B1 | 8/2001 | Takigawa et al. ........... 257/787 |
| 6,342,577 B1 | 1/2002 | Konarski et al. .............. 528/94 |

FOREIGN PATENT DOCUMENTS

| DE | 1017612 | 1/1966 | |
| DE | 33 17 197 | 10/1984 | ........... H01L/23/30 |
| EP | 0 352 550 | 7/1989 | ........... C08L/63/04 |
| EP | 0 547 905 A1 | 12/1992 | ........... C08G/59/02 |
| JP | 73003238 | 2/1970 | ........... C08G/30/14 |
| JP | 59 99748 | 6/1984 | ........... C08G/59/62 |
| JP | 61 254654 | 8/1985 | ........... C08L/63/00 |
| JP | 63193915 | 8/1988 | ........... C08G/59/18 |
| JP | 63199218 | 8/1988 | ........... C08G/59/24 |
| JP | 02 175749 A | 7/1990 | ........... C08L/63/00 |
| JP | 11 106480 A2 | 4/1999 | |
| JP | 11 106481 A2 | 4/1999 | |
| JP | 2001220429 | * 8/2001 | |
| WO | WO 98/37134 | 8/1998 | ........... C08K/3/20 |
| WO | WO 99/05196 | 2/1999 | ........... C08G/59/68 |

OTHER PUBLICATIONS

Chem. Abstracts(CAPLUS) Abstract2001:569775,Aug. ,2001.*
Japanese Pat. Office translation of JP'429, produced Jan. 2004.*
D.W. House, et al., The Versatility of Secondary Diamines in Polyurethane and Polyurea Systems (Sep., 1995).
C.P. Wong et al., "High Performance No–Flow Underfills for Low–Test Flip Chip Applications: Material Characterization", *IEEE Transactions on Components, Pack'gand Man'g Tech.—Part A*, 21, 3, 450–58 (Sep. 1998).
"Thioplast", AKCROS Chemicals, Manchester, Great Britain (Undated).
"Thiokol LP–3" Construction Adhesives, Adhesives and Sealants, Rohm and Haas, Jan., 2001.
Lee & Neville, "Handbook of Epoxy Resins", McGraw–Hill Book Co., NY 1967, pp 1–2 and 13–7 to 13–9.
D.W. House, et al., The Versatility of Secondary Diamines in Polyurethane and Polyurea Systems (Sep., 1995).
C.P. Wong et al., "High Performance No–Flow Underfills for Low–Test Flip Chip Applications: Material Characterization", *IEEE Transactions on Components, Pack'g and Man'g Tech.—Part A*, 21, 3, 450–58 (Sep. 1998).
"Thioplast", AKCROS Chemicals, Manchester, Great Britain (Undated).
"Thiokol LP–3" Construction Adhesives, Adhesives and Sealants, Rohm and Haas, Jan., 2001.
Lee & Neville, "Handbook of Epoxy Resins", McGraw–Hill Book Co., NY 1967, pp 1–2 and 13–7 to 13–9.

* cited by examiner

*Primary Examiner*—Philip Tucker
*Assistant Examiner*—David E. Aylward
(74) *Attorney, Agent, or Firm*—Steven C. Bauman

(57) ABSTRACT

The present invention provides a thermosetting resin composition useful as a highly filled low CTE underfilling sealant composition which completely fills the underfill space in a semiconductor device, such as a flip chip assembly which includes a semiconductor chip mounted on a carrier substrate, enables the semi-conductor to be securely connected to a circuit board by heat curing and with good productivity, and demonstrates acceptable heat shock properties (or thermal cycle properties). The thermosetting resin composition which is used as an underfilling sealant between such a semiconductor device and a circuit board to which the semiconductor device is electrically connected, includes an epoxy resin component, a latent hardener component, and a polysulfide-based toughening component. The latent hardener component includes a modified amide component and a latent catalyst therefor. Optionally, the inventive composition includes a filler, desirably at least a portion of the filler should have a particle size in the range of 1 to 1,000 nanometers.

24 Claims, 1 Drawing Sheet

THERMOSETTING RESIN COMPOSITIONS USEFUL AS UNDERFILL SEALANTS

RELATED APPLICATION DATA

This application claims the benefit of an earlier effective filing date from U.S. Provisional Application No. 60/331,523, filed Nov. 19, 2001.

BACKGROUND OF THE INVENTION

1. Field of the Invention

This invention relates to thermosetting resin compositions useful as underfill sealants for mounting to a circuit board semiconductor chips or semiconductor device packages, which have a semiconductor chip on a carrier substrate. Reaction products of these compositions demonstrate improved adhesion after exposure to elevated temperature conditions, improved resistance to moisture absorption and improved resistance to stress cracking.

2. Brief Description of Related Technology

In recent years, the popularity of smaller-sized electronic appliances has made desirable size reduction of semiconductor devices. As a result, chip packages are becoming reduced in size to substantially that of the bare die themselves. Such smaller-sized chip packages improve the characteristics of the microelectronic device in which it is used, while retaining many beneficial operating features. This serves to protect semiconductor bare chips, and increases their reliability and useful life.

Ordinarily, chip assemblies are connected to electrical conductors on a circuit board by use of solder connection or the like. However, when the resulting chip/circuit board structure is subjected to conditions of thermal cycling, reliability becomes suspect due to fatigue of the solder connection between the circuit board and the chip assembly. Recent manufacturing advances provide a sealing resin (often referred to as underfill sealant) in the space created by the mounting of a direct chip attach package ("DCA") [such as a chip scale package ("CSP")/ball grid array ("BGA")/land grid array ("LGA") assembly or a flip chip ("FC") assembly] onto a circuit board to relieve stresses caused by thermal cycling. Underfill sealants have been seen to improve heat shock properties and enhance the reliability of such structures.

Of course, curable resin compositions generally are known. See e.g., U.S. Pat. No. 4,645,803 (Kohli), which relates to curable epoxy resin compositions of reinforcing filaments and epoxy resins together with a primary amine-functional curing agent with or without a polyamine curing agent and a curing catalyst which when cured into a fiber matrix is useful in preparing composites and prepreg materials for structural applications.

In addition, U.S. Pat. No. 4,499,245 (Ikeguchi) relates to a curable resin composition requiring a mixture and/or a reaction product of (a) a polyfunctional dicyandiamide, prepolymer of the dicyandiamide or coprepolymer of the dicyandiamide and an amine and (b) a polyhydantion resin—a phenolic-based epoxy curative. In addition, a polyfunctional maleimide, prepolymer of the maleimide or coprepolymer of the maleimide and an amine may be included as a component (c). These compositions are reported to be useful as coating materials for rust prevention, flame resistance, flame retardation; electrical insulation varnish; and laminates for use with furniture, building materials, and sheathing materials.

More specifically, thermosetting compositions of dicyandiamides and epoxy resins are also generally known. See e.g., Japanese patent document JP 62-275,123, an English-language abstract of which speaks to a resin composition for preparing prepreg materials with reinforcing fiber for structural applications. The compositions are reported to include certain dicyandiamides, bismaleimide, polyether sulfone (as a non-reactive thermoplast whose use is as a toughening agent) and bisphenol F- or A-type epoxy resin. In addition, the composition is reported to be optionally hardened by a hardening catalyst, one of which is noted as imidazole.

U.S. Pat. No. 4,918,157 (Gardner) relates to the use of urea compounds as latent cure accelerators for dicyandiamides, and to thermosetting dicyandiamide formulations of dicyandiamides and urea compounds. More specifically, the '157 patent claims a thermosetting composition of a dicyandiamide; a urea compound selected from alkyl aryl ureas, aryl ureas and mixtures thereof; and an epoxy resin. The curable dicyandiamide formulations of the '157 patent are reportedly useful as matrix resins, and for the production of prepreg, fiber-reinforced laminates, composites and the like.

Epoxy curing systems are also known. See e.g., U.S. Pat. No. 3,862,260 (Sellers), in which a curing agent of a trifunctional hardener (such as the reaction product of one mole of bisphenol A with one mole of formaldehyde) and an imidazole is disclosed.

These uses for thermosetting resin compositions appear to be directed to structural applications, as contrasted to the microelectronic application to which the compositions of the present invention are directed. To that end, the use of epoxy resin compositions as matrix compositions for fiber reinforcement in prepreg, composite and laminate materials for structural materials differs significantly from the use of epoxy resin compositions as an adhesive and encapsulant in microelectronic applications, such as with electrical solder junctions in semiconductor chips, and creates different demands and requirements from the uncured resin as well as cured reaction products thereof.

A drawback to resin compositions presently used in microelectronics applications, such as for underfill sealants, has been the ability of providing such resins with a commercially acceptable useful working life at room temperature or dispensing temperatures.

Generally, at temperatures near room temperature, the resins begin to cure upon introduction of the curing agent or catalyst. This causes viscosity increases which leads to reduced dispensability. While such viscosity increase may be alleviated to some degree by using a liquid curing agent or catalyst, liquid catalysts tend to decrease latency to a point which is not commercially practical with current production demands. And introduction of a solid catalyst, such as imidazole, has limited applicability because its presence often changes the rheological properties of the composition, and decreases flow.

Thus, due at least in part to their limited useful working life, manufacturing capacity of certain microelectronic production lines has been hampered by these shortcomings of conventional underfill sealant compositions.

Accordingly, it would be desirable for an underfilling sealant composition to provide good adhesive properties while flowing and curing in a reasonable time to be commercially appealing and possessing an extended useful working life.

SUMMARY OF THE INVENTION

The present invention provides a thermosetting resin composition useful as an underfilling sealant composition which (1) fills the underfill space in a semiconductor device, such as a FC assembly which includes a semiconductor chip mounted on a carrier substrate or a CSP, which includes a semiconductor chip mounted on a carrier substrate, (2) enables the semiconductor to be securely connected to a circuit board by short-time heat curing and with good productivity, (3) demonstrates excellent heat shock properties (or thermal cycle properties), and (4) provides a composition that does not begin to cure at conventional underfill dispensing temperatures and exhibits commercially desirable flow properties, even when highly filled with an inorganic filler, such as at or above a 75 weight percent filler loading level.

The thermosetting resin compositions of this invention, which are used as underfill sealants between such a semiconductor device and a circuit board to which the semiconductor device is electrically connected, include an epoxy resin component, a latent hardener component and a polysulfide-based toughening component. The latent hardener component includes a modified amide component, such as dicyandiamide, a latent catalyst therefor, such as an imidazole, a diazabicycloundecaene ("DBU") salt, a tertiary amine salt, and/or a modified urea. Desirably, the latent catalyst is an imidazole, particularly one in the solid state.

By using the thermosetting resin compositions of this invention, semiconductor devices, such as flip chip assemblies, may be (1) assembled quickly and without production line down time because of improved cure speed and extended useful working life, and (2) securely connected to a circuit board by short-time heat curing of the composition, with the resulting mounted structure (at least in part due to the cured composition) demonstrating excellent heat shock properties (or thermal cycle properties).

The compositions of this invention may also be used for microelectronic applications beyond sealing underfill, such as with glob top, die attachment and other applications for thermosetting compositions in which high filler loadings and an extended useful working life are desirable.

The benefits and advantages of the present invention will become more readily apparent after a reading of the "Detailed Description of the Invention" together with the figure.

DETAILED DESCRIPTION OF THE INVENTION

Figure 1:
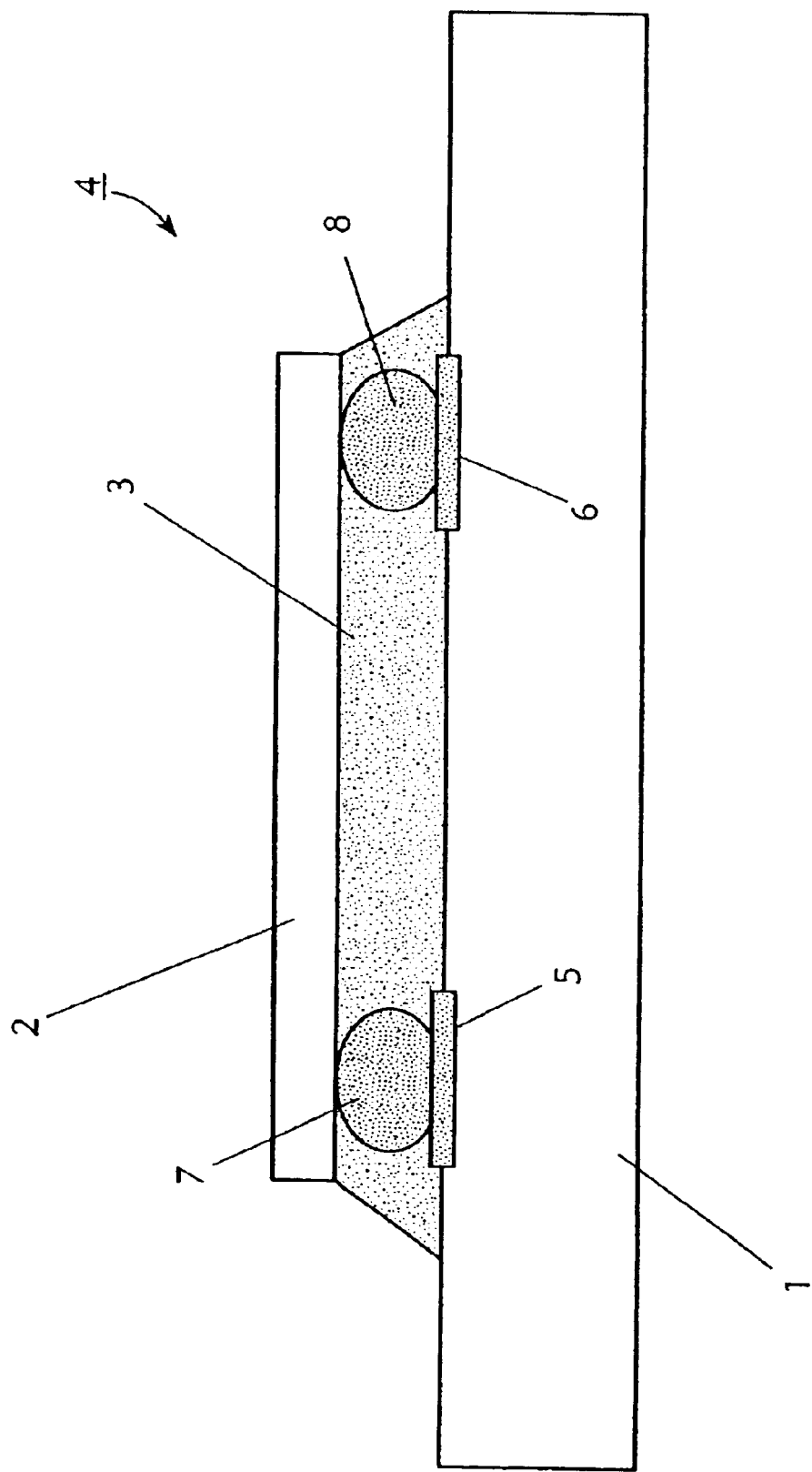
FIG. 1 depicts a cross-sectional view showing an example of a mounted structure with which the thermosetting resin composition of the present invention is used as an underfill sealant.

As noted above, the thermosetting resin compositions, which are useful as underfill sealants between a semiconductor device and a circuit board to which the semiconductor device is electrically connected, include an epoxy resin component, a latent hardener component and a polysulfide-based toughening component. The latent hardener component includes a modified amide component, such as dicyandiamide, a latent catalyst, such as an imidazole, a DBU salt, a tertiary amine salt, and/or a modified urea. Desirably, the latent catalyst is an imidazole, particularly one in the solid state. Optionally, the inventive composition includes a filler, desirably at least a portion of the filler should have a particle size in the range of 1 to 1,000 nanometers.

Typically, an unfilled inventive composition includes about 100 parts by weight of the epoxy resin component; 0 to about 30 parts by weight, such as about 5 to about 25 parts, dersirably about 10 parts, of the latent hardener component, of which 0 to about 15 parts, such as about 5 to about 10 parts, desirably 7 parts, is comprised of the modified amide component, such as dicyandiamide and 0 to about 15 parts, such as about 1 to about 5 parts, such as about 3 parts, is comprised of the latent catalyst therefor, such as an imidazole, a DBU salt, a tertiary amine, and/or a modified urea; and 0 to about 30 parts, such as about 5 to about 25 parts, desirably about 10 parts, of the polysulfide-based toughening component.

The epoxy resin component of the present invention may include any common epoxy resin. This epoxy resin may be comprised of at least one multifunctional epoxy resin, optionally, together with at least one monofunctional epoxy resin. Ordinarily, the multifunctional epoxy resin should be included in amount within the range of about 20 parts to about 100 parts of the epoxy resin component. In the case of bisphenol F-type epoxy resin, desirably the amount thereof should be in the range of from about 40 to 80 parts.

A monofunctional epoxy resin, if present, should ordinarily be used as a reactive diluent, or crosslink density modifier. In the event such a monofunctional epoxy resin is included as a portion of the epoxy resin component, such resin should be employed in an amount of up to about 20% by weight based on the total epoxy resin component.

The monofunctional epoxy resin should have an epoxy group with an alkyl group of about 6 to about 28 carbon atoms, examples of which include $C_6$–$C_{28}$ alkyl glycidyl ethers, $C_6$–$C_{28}$ fatty acid glycidyl esters and $C_6$–$C_{28}$ alkylphenol glycidyl ethers.

Such epoxy resin(s) include generally, but are not limited to, polyglycidyl ethers of polyvalent phenols, for example pyrocatechol; resorcinol; hydroquinone; 4,4'-dihydroxydiphenyl methane; 4,4'-dihydroxy-3,3'-dimethyldiphenyl methane; 4,4'-dihydroxydiphenyl dimethyl methane; 4,4'-dihydroxydiphenyl methyl methane; 4,4'-dihydroxydiphenyl cyclohexane; 4,4'-dihydroxy-3,3'-dimethyldiphenyl propane; 4,4'-dihydroxydiphenyl sulfone; tris(4-hydroxyphyenyl)methane; polyglycidyl ethers of the chlorination and bromination products of the above-mentioned diphenols; polyglycidyl ethers of novolacs (i.e., reaction products of monohydric or polyhydric phenols with aldehydes, formaldehyde in particular, in the presence of acid catalyst; polyglycidyl ethers of diphenols obtained by esterifying 2 moles of the ethers of diphenols obtained by esterifying 2 moles of the sodium salt of an aromatic hydrocarboxylic acid with 1 mole of a dihaloalkane or dihalogen dialkyl ether (see U.K. Pat. No. 1,017,612, the disclosure of which is hereby expressly incorporated herein by reference); and polyglycidyl ethers of polyphenols obtained by condensing phenols and long-chain halogen paraffins containing at least two halogen atoms (see U.K. Pat. No. 1,024,288, the disclosure of which is hereby expressly incorporated herein by reference).

Commercially available examples of reactive diluents from CVC Chemicals include o-cresyl glycidyl ether (GE-10), p-t-butyl phenyl glycidyl ether (GE-11), neopentyl glycol di-glycidyl ether (GE-20), 1,4-butanediol di-glycidyl ether (GE-21), and cyclohexanedimethanol glycidyl ether (GE-22). Other reactive diluents available commercially from CVC include castor oil tri-glycidyl ether (GE-35) and propoxylated glycerin tri-glycidyl ether (GE-36).

Other suitable epoxy compounds include polyepoxy compounds based on aromatic amines and epichlorohydrin, such as N,N'-diglycidyl-aniline; N,N'-dimethyl-N,N'-diglycidyl- 4,4'-diaminodiphenyl methane; N,N,N',N'-tetraglycidyl-4, 4'-diaminodiphenyl methane; N-diglycidyl-4-aminophenyl glycidyl ether; and N,N,N',N'-tetraglycidyl-1,3-propylene bis-4-aminobenzoate.

Particularly desirable examples of the multifunctional epoxy resin include bisphenol A-type epoxy resin, bisphenol F-type epoxy resin, phenol novolac-type epoxy resin, and cresol novolac-type epoxy resin.

Among the epoxy resins suitable for use herein are polyglycidyl derivatives of phenolic compounds, such as those available commercially under the tradenames EPON 828, EPON 1001, EPON 1009, and EPON 1031, from Shell Chemical Co.; DER 331, DER 332, DER 334, and DER 542 from Dow Chemical Co.; RE-310-S, RE-404-S and BREN-S from Nippon Kayaku, Japan. Other suitable epoxy resins include polyepoxides prepared from polyols and the like and polyglycidyl derivatives of phenol-formaldehyde novolacs, the latter of which are available commercially under the tradenames DEN 431, DEN 438, and DEN 439 from Dow Chemical Company. Cresol analogs are also available commercially ECN 1235, ECN 1273, and ECN 1299 from Vantico, Inc. SU-8 is a bisphenol A-type epoxy novolac available from Interez, Inc. Polyglycidyl adducts of amines, aminoalcohols and polycarboxylic acids are also useful in this invention, commercially available resins of which include GLYAMINE 135, GLYAMINE 125, and GLYAMINE 115 from F.I.C. Corporation; ARALDITE MY-720, ARALDITE MY-721, ARALDITE MY-722, ARALDITE 0500, and ARALDITE 0510 from Vantico and PGA-X and PGA-C from the Sherwin-Williams Co.

And of course combinations of the different epoxy resins are also desirable for use herein.

In choosing epoxy resins for the epoxy resin component of the compositions of the present invention, consideration should also be given to viscosity and other properties. As noted, the latent hardener includes a modified amide and a latent catalyst therefor.

The modified amide, such as the cyano-functionalized amide dicyandiamide or cyanoguanidine (available commercially as CG-1400 or CG-1600 from Air Products), may be included in an amount up to about 5 weight percent, such as about 1 to about 2 weight percent, based on the total composition.

The latent catalyst for the modified amide includes imidazoles, such as imidazole and derivatives thereof, such as isoimidazole, imidazole, alkyl substituted imidazoles, such as 2-methyl imidazole, 2-ethyl-4-methylimidazole, 2,4-dimethylimidazole, butylimidazole, 2-heptadecenyl-4-methylimidazole, 2-methylimidazole, 2-undecenylimidazole, 1-vinyl-2-methylimidazole, 2-n-heptadecylimidazole, 2-undecylimidazole, 2-heptadecylimidazole, 2-phenylimidazole, 2-ethyl 4-methylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole and addition products of an imidazole methylimidazole and addition products of an imidazole and trimellitic acid, 2-n-heptadecyl-4-methylimidazole and the like, generally where each alkyl substituent contains up to about 17 carbon atoms and desirably up to about 6 carbon atoms; aryl substituted imidazoles, such as phenylimidazole, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethylaminophenyl)-4,5-diphenylimidazole, 2-(2-hydroxyphenyl)-4,5-diphenylimidazole, di(4,5-diphenyl-2-imidazole)-benzene-1,4,2-naphthyl-4,5-diphenylimidazole, 1-benzyl-2-methylimidazole, 2-p-methoxystyrylimidazole, 2-phenyl-4,5-dihydroxymethylimidazole (commercially available under the tradename 2PHZ from Shikoku, Tokyo, Japan) and the like, generally where each aryl substituent contains up to about 10 carbon atoms and desirably up to about 8 carbon atoms.

Particulary desirable latent catalysts include DBU-phenolate, available commercially from Air Products under the tradename SA1, DBU-hexanoate available commercially from Air Products under the tradename SA102, DBU-formate available commercially from, Air Products under the tradename SA610, and DBU-p-toluenesulfonate available commercially from Air Products under the tradename SA501.

Still other latent catalysts include phenyldimethyl urea, available commercially from CVC under the tradename U-405, toluene bis(dimethyl urea) available commercially from CVC under the tradename U-410, and methylene diphenyl bis(dimethyl urea), available commercially from CVC under the tradename U415.

Tertiary amine salts are also desirable.

Of course, combinations of these latent catalysts are also desirable.

As the polysulfide-based toughening component, many materials may be used. For instance, a polysulfide-based toughening components of the general formulae may be used:

and

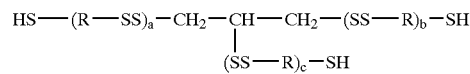

where R is an alkyl ether, such as —(CH$_2$)$_2$—O—CH$_2$—O—(CH$_2$)$_2$—, and a+b+c=n.

A particularly desirable material is known as THIOKOL LP-3, available commercially from Rohm and Haas Company, Philadelphia, Pa., where n is 6 and about 2 mole percent branching exists. LP-3 is also reported to have a molecular weight of about 1,000.

Another particularly desirable material is avaliable commericially from Akcros Chemicals, Manchester, Great Britain under the tradename THIOPLAST, such as G1 (n is 19–21, 1.8–2 percent thiol content, and a 3,300–3,700 molecular weight), G4 (n is less than 7, less than 5.9 percent thiol content, and less than 1,100 molecular weight), G12 (n is 23–26, 1.5–1.7 percent thiol content, and a 3,900–4,400 molecular weight), G21 (n is 12–15, 2.5–3.1 percent thiol content, and a 2,100–2,600 molecular weight), G22 (n is 14–18, 2.1–2.7 percent thiol content, and a 2,400–3,100 molecular weight), G112 (n is 23–25, 1.5–1.7 percent thiol content, and a 3,900–4,300 molecular weight), and G131 (n is 30–38, 1.5–1.7 percent thiol content, and a 5,000–6,500 molecular weight). The THIOPLAST polysulfide-based toughening components are reported to be prepared from the polycondensation of bis-(2-chloro-ethyl-)formal with alkali polysulfide.

During application, the thermosetting resin compositions according to the present invention penetrate and flow readily into the space between the circuit board and the semiconductor device, or at least show a reduction in viscosity under heated or use conditions thus penetrating and flowing easily.

Generally, it is desirable to prepare the thermosetting resin compositions of this invention by selecting the types and proportions of various so that the gel times will be tailored to a specified period of time (such as about 5 minutes or 6 minutes) at a temperature of about 165° C. In such cases, the inventive compositions should show no or substantially no increase of viscosity after a period of time of about 30 minutes at underflow temperatures of about 90 to about 130° C. With such a gel time, the compositions penetrate into the space between the circuit board and the semiconductor device (e.g., of 50 to 200 μm) relatively uniformly, and allow for an assembly of greater size to be filled without observing a viscosity increase in the composition thereby rendering it less effective for application.

Optionally, the thermosetting resin composition of the present invention may further contain other additives such as transition metal complexes as catalysts, defoaming agents, leveling agents, dyes, pigments and fillers. Moreover, the compositions may also contain photopolymerization initiators, provided such materials do not adversely affect the desired properties of the composition.

The transition metal complex may be chosen from a variety of organometallic materials or metallocenes. Those materials of particular interest herein may be represented by metallocenes within structure I:

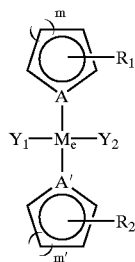

where $R_1$ and $R_2$ may be the same or different and may occur at least once and up to as many four times on each ring in the event of a five-membered ring and up to as many as five times on each ring in the event of a six-membered ring;

$R_1$ and $R_2$ may be selected from H; any straight- or branched-chain alkyl constituent having from 1 to about 8 carbon atoms, such as —$CH_3$, —$CH_2CH_3$, —$CH_2CH_2CH_3$, —$CH(CH_3)_2$, —$C(CH_3)_3$ or the like; acetyl; vinyl; allyl; hydroxyl; carboxyl; —$(CH_2)_n$—OH, where n may be an integer in the range of 1 to about 8; —$(CH_2)_n$—$COOR_3$, where n may be an integer in the range of 1 to about 8 and $R_3$ may be any straight- or branched-chain alkyl constituent having from 1 to about 8 carbon atoms; H; Li; Na; —$(CH_2)_n$—$OR_4$, wherein n may be an integer in the range of 1 to about 8 and $R_4$ may be any straight- or branched-chain alkyl constituent having from 1 to about 8 carbon atoms; or —$(CH_2)_nN^+(CH_3)_3$ $X^-$, where n may be an integer in the range of 1 to about 8 and X may be $Cl^-$, $Br^-$, $I^-$, $ClO_4^-$ or $BF_4^-$;

$Y_1$ and $Y_2$ may not be present at all, but when at least one is present they may be the same or different and may be selected from H, $Cl^-$, $Br^-$, $I^-$, cyano, methoxy, acetyl, hydroxy, nitro, trialkylamines, triarylamines, trialkylphosphines, triphenylamine, tosyl and the like; A and A' may be the same or different and may be C or N;

m and m' may be the same or different and may be 1 or 2; and $M_e$ is Fe, Ti, Ru, Co, Ni, Cr, Cu, Mn, Pd, Ag, Rh, Pt, Zr, Hf, Nb, V, Mo and the like.

Of course, depending on valence state, the element represented by $M_e$ may have additional ligands—$Y_1$ and $Y_2$—associated therewith beyond the carbocyclic ligands depicted above (such as where $M_e$ is Ti and $Y_1$ and $Y_2$ are $Cl^-$).

Alternatively, metallocene structure I may be modified to include materials such as those within structure II below:

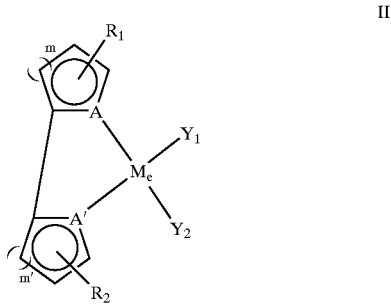

where $R_1$, $R_2$, $Y_1$, $Y_2$, A, A', m, m' and $M_e$ are as defined above.

A particularly desirable example of such a material is where $R_1$ and $R_2$ are each H; $Y_1$ and $Y_2$ are each Cl; A and A' are each N; m and m' are each 2 and $M_e$ is Ru.

Within metallocene structure I, well-suited metallocene materials may be chosen from within metallocene structure III:

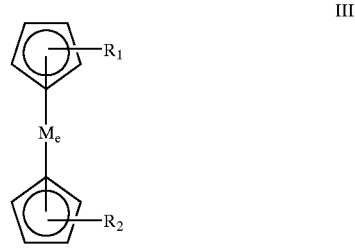

where $R_1$, $R_2$ and $M_e$ are as defined above.

Particularly well-suited metallocene materials from within structure I may be chosen where $R_1$, $R_2$, $Y_1$, $Y_2$, m and m' are as defined above, and $M_e$ is chosen from Ti, Cr, Cu, Mn, Ag, Zr, Hf, Nb, V and Mo.

Desirably, the metallocene is selected from ferrocenes (i.e., where $M_e$ is Fe), such as ferrocene, vinyl ferrocenes, ferrocene derivatives, such as butyl ferrocenes or diarylphosphino metal-complexed ferrocenes [e.g., 1,1-bis (diphenylphosphino) ferrocene-palladium dichloride], titanocenes (i.e., where $M_e$ is Ti), such as bis($n^5$-2,4-cyclopentadien-1-yl)-bis-[2,6-difluoro-3-(1H-pyrrol-1-yl) phenyl] titanium which is available commercially from Ciba Specialty Chemicals, Tarrytown, N.Y. under the tradename "IRGACURE" 784DC, and derivatives and combinations thereof. A particularly desirable metallocene is ferrocene.

And bis-alkylmetallocenes, for instance, bis-alkylferrocenes (such as diferrocenyl ethane, propanes, butanes and the like) are also desirable for use herein, particularly since about half of the equivalent weight of the material (as compared to a non-bis-metallocene) may be employed to obtain the sought-after results, all else being unchanged. Of these materials, diferrocenyl ethane is particularly desirable.

Of course, other materials are well-suited for use $M_e[CW_3-CO-CH=C(O^-)-CW'_3]_2$, where $M_e$ is as defined above, and W and W' may be the same or different and may be selected from H, and halogens, such as F and Cl. Examples of such materials include platinum (II) acetylacetonate ("PtACAC"), cobalt (II) acetylacetonate ("Co(II)ACAC"), cobalt (III) acetylacetonate ("Co(III)ACAC"), nickel (II) acetylacetonate ("NiACAC"), iron (II) acetylacetonate ("Fe(II)ACAC"), iron (III) acetylacetonate ("Fe(III)ACAC"), chromium (II) acetylacetonate ("Cr(II)ACAC"), chromium (III) acetylacetonate ("Cr(III)ACAC"), manganese (II) acetylacetonate ("Mn(II)ACAC"), manganese (III) acetylacetonate ("Mn(III)ACAC") and copper (II) acetylacetonate ("CuACAC").

Of course, combinations of these transition metal complexes may also be employed.

In another additional aspect of this invention, there is provided filled thermosetting compositions. These compositions, in addition to the epoxy resin component and latent hardener component, include a filler component.

The filler component acts to lower moisture pick up, and tends to increase viscosity. Appropriate filler components include silica, alumina, silica-coated aluminum nitride, silver flake and the like.

In addition, the filler desirably acts to better match the coefficient of thermal expansion ("CTE") of the substrates with which the inventive compostions are intended to be used. For instance with respect to an underfill application in which a semiconductor chip is to be bonded to a circuit board, the underfill space between the chip and board may be sealed with the inventive composition.

In this regard, the particle size of the filler is desirably in the range of about 0.1–10 microns, such as on the order of about 2 microns. A silica filler having such a particle size is commercially available from Admatechs, Japan under the tradename ADMAFINE, such as ADMAFINE designations SO—C1 (average particle size, 0.2 microns); SO—C2 (average paricle size, 0.4–0.6 microns); SO—C3 (average paricle size, 0.8–1.2 microns); SO—C5 (average paricle size, 1.5–2.0 microns); SO-E1 (average paricle size, 0.2 microns); SO-E2 (average paricle size, 0.4–0.6 microns); SO-E3 (average paricle size, 0.8–1.2 microns); and SO-E5 (average paricle size, 1.5–2.0 microns). The SO-E versions have low iron (<2 ppm), low aluminum (6 ppm), low calcium (<2 ppm), and low chloride (<0.5 ppm).

Another source of silica filler with such particle size range is Tokuyama Corporation, Yamaguchi, Japan, which makes available commercially under the tradename EXCELICA, grades SE-8 (average particle size, 7.9 microns—particle size distribution: more than 150 microns, <0.001%; 106–150 microns, <0.01%; 75–106 microns, 0.0%; 45–75 microns, 0.2%; and less than 45 microns, 99.8%); SE-5 (average particle size, 5.1 microns—particle size distribution: more than 150 microns, <0.001%; 106–150 microns, <0.01%; 75–106 microns, 0.0%; 45–75 microns, 0.1%; and less than 45 microns, 99.9%); SE-3B (average particle size, 3.0 microns—particle size distribution: more than 20 microns, <0.1%); and SE-1 (average particle size, 1.9 microns).

In order to improve further these physical properties at least a portion of the filler component may include filler particles in the 1–1,000 nanometer ("nm") range. A commercially available example of such filler particles is sold under the tradename NANOPOX, such as NANOPOX XP 22, by Hans Chemie, Germany. NANOPOX fillers are monodisperse silica filler dispersions in epoxy resins, at a level of up to about 50% by weight. NANOPOX fillers ordinarily are believed to have a particle size of about 5 nm to about 80 nm. And NANOPOX XP 22 is reported to contain 40 weight percent of silica particles having a particle size of about 15 nm in the diglycidyl ether of bisphenol-F epoxy resin.

Other desirable materials for use as the inorganic filler component include those constructed of or containing aluminum oxide, silicon nitride, aluminum nitride, silica-coated aluminum nitride, boron nitride and combinations thereof.

When used, the inorganic filler component should be used in an amount of about 10 to about 80 percent by weight of the compostion, such as about 25 to about 75 percent by weight, desirably within the range of about 35 to about 70 percent by weight.

Reference to FIG. 1 shows a mounted structure (i.e., a flip chip package) in which a thermosetting resin composition of the present invention has been applied and cured.

The flip chip package 4 is formed by connecting a semiconductor chip (a bare chip) 2 to a carrier substrate 1 (e.g., a circuit board) and sealing the space therebetween suitably with a thermosetting resin composition 3. This semiconductor device is mounted at a predetermined position on the carrier substrate 1, and electrodes 5 and 6 are electrically connected by a suitable electrical connection means 7 and 8, such as solder. In order to improve reliability, the space between the semiconductor chip 2 and the carrier substrate 1 is sealed with the inventive thermosetting resin composition 3, and then cured. The cured product of the thermosetting resin composition should completely fill that space.

Carrier substrates may be constructed from ceramic substrates of $Al_2O_3$, $SiN_3$ and mullite ($Al_2O_3$—$SiO_2$); substrates or tapes of heat-resistant resins, such as polyimides; glass-reinforced epoxy; ABS and phenolic substrates which are also used commonly as circuit boards; and the like. Any electrical connection of the semiconductor chip to the carrier substrate may be used, such as connection by a high-melting solder or electrically (or anisotropically) conductive adhesive, wire bonding, and the like. In order to facilitate connections, the electrodes may be formed as bumps.

After the semiconductor chip is electrically connected to the carrier substrate, the resulting structure is ordinarily subjected to a continuity test or the like. After passing such test, the semiconductor chip may be fixed thereto with a thermosetting resin composition, as described below. In this way, in the event of a failure, the semiconductor chip may be removed before it is fixed to the carrier substrate with the thermosetting resin composition.

Using a suitable application means, such as a dispenser, a thermosetting resin composition in accordance with this invention is applied to the periphery of the electronically-connected semiconductor chip. The composition penetrates by capillary action into the space between the carrier substrate and the semiconductor chip.

The thermosetting resin composition is then thermally cured by the application of heat. During the early stage of this heating, the thermosetting resin composition shows a significant reduction in viscosity and hence an increase in fluidity, so that it more easily penetrates into the space between the carrier substrate and the semiconductor chip. Moreover, by preheating the carrier substrate, the thermosetting resin composition is allowed to penetrate fully into the entire space between the carrier substrate and the semiconductor chip.

Cured reaction products of the thermosetting resin compositions of the present invention demonstrate excellent adhesive force, heat resistance and electric properties, and acceptable mechanical properties, such as flex-cracking resistance, chemical resistance, moisture resistance and the like, for the applications for which they are used herein.

The amount of thermosetting resin composition applied should be suitably adjusted so as to fill the space between the carrier substrate and the semiconductor chip, which amount of course may vary depending on application.

Thermosetting resin compositions of the present invention may ordinarily be cured by heating to a temperature in the range of about 140° C. to about 180° C. for a period of time of about 30 minutes to about 2 hours. However, generally after application of the composition, an initial cure time of about 10 minutes sets up the composition, and complete cure is observed after about 90 minutes at about 165° C. Thus, the composition of the present invention can be at moderately high temperatures and with long underfilling times which are necessary to achieve very low CTEs with high filler loadings and large sized dice.

The present invention will be more readily appreciated with reference to the examples which follow.

EXAMPLES

Example 1

In this example, compositions in accordance with the present invention were prepared and evaluated for performance in contrast with compositions prepared without the dicyandiamide component or the latent hardener component. The compositions are set forth in Table 1.

TABLE 1

| Component | | Composition/(wt. %) | | | |
|---|---|---|---|---|---|
| Type | Identity | A | B | C | D |
| Epoxy | Bisphenol F | 25.75 | 22.27 | 28.3 | 27.25 |
| Polysulfide Toughener | LP-3 | 2.5 | 2.3 | 2.7 | 2.5 |
| Imidazole | 2PHZ (Solid) | 0.25 | 0.23 | 1.5 | 0.25 |
| Dicyandamide | CG-1400 | 1.5 | 1.2 | — | — |
| Silica | SO-E5 | 70 | 74 | 67.5 | 70 |

Performance is evaluated in terms of capillary flow distance of the liquid composition and glass transition temperature ("Tg") of the cured composition, results for which are set forth in Table 2.

TABLE 2

| | Composition | | | |
|---|---|---|---|---|
| Physical Property | A | B | C | D |
| 50 Micron-gap, flow distance @ 120° C. | >60 mm | >60 mm | 23 mm | >60 |
| Tg | 105° C. | 109° C. | 94° C. | 62° C. |

Compositions A and B illustrate the benefits of including a modified amide, such as dicyandiamide. The inclusion of this component permits the composition to penetrate small gaps for long distances (>60 mm), while maintaining good Tg values and high filler loadings. In contrast, Composition C has a significantly shorter flow distance even at a lower filler loading, and Composition D has a low Tg value, making it unattractive for many end use applications.

Example 2

In this example, in contrast to Example 1, compositions were prepared and evaluated without the polysulfide-based toughening component. The composition componets are listed in Table 3. Performance is evaluated in terms of flow distance, moisture absorption and fracture toughenss ($K_1C$), the results of which are shown in Table 4.

TABLE 3

| COMPONENT | | COMPOSITION/(WT. %) | | | | | |
|---|---|---|---|---|---|---|---|
| Type | Identity | E | F | G | H | E1 | E2 |
| Epoxy | Bisphenol F | 25.7 | 28.55 | 28.05 | 28.05 | 20 | 15 |
| Polysulfide Toughener | LP-3 | 3 | — | — | — | 3 | 3 |
| Dicyandiamide | CG-1400 | 1 | 1.1 | 1.1 | 1.1 | 1 | 0.9 |
| Imidazole | 2PHZ (Solid) | 0.3 | 0.35 | 0.35 | 0.35 | 0.3 | 0.25 |
| CTBN Toughener | HYCAR 1300X8 | — | — | 3 | — | — | — |
| Aerylate Rubber Toughener | TACTIX X071790a | — | — | — | 3 | — | — |
| Filler | SO-E5 | 70 | 70 | 67.5 | 67.5 | 70 | 70 |
| | NANOPOX | — | — | — | — | 5.7 | 10.85 |

TABLE 4

| | Composition | | | | | |
|---|---|---|---|---|---|---|
| Physical Property | E | F | G | H | E1 | E2 |
| 50 micron-gap Flow Distance @ 120° C. | >60 mm | >60 mm | 36 mm | 42 mm | >60 mm | 56 mm |
| Water Absorption 121° C./100% RH/2 ATM 96 hr. Pressure Cooker | 1.7% | 1.8% | 2.4% | 2.3% | 1.6% | 1.4% |
| Fracture Toughness, $K_1C$ | 2.42 | 1.51 | 2.17 | 2.07 | — | — |

*$K_1C$ estimated from other formulations with similar filler and toughener levels.

The use of the polysulfide-based toughener, LP-3, in Composition E demonstrates a desirable balance of high flow behaviour and toughness. However, the use of conventional tougheners, such as a CTBN toughener (Composition G) and on acrylate rubber toughener (Composition H), do not exhibit the same desirable combination of physical properties. In addition, Compositions G and H demonstrate significantly moisture uptake, which is seen as detrimental.

The use of a nanoparticle-sized silica filler in combination with a micron-sized silica filler allowed for a greater filler level to be achieved (72.3 weight percent for Composition E1 and 74.3 weight percent for Composition E2, compared with 70 weight percent for Composition E), as well as permitting the compositions to maintain their flow distance properties and acheive a further reduction in the amount of moisture absorption.

Example 3

In this example, compositions were prepared with a solid imidazole and a liquid imidazole, and evaluated for performance. The compositions are set forth in Table 5.

TABLE 5

| Component | | Composition/(wt. %) | | | |
|---|---|---|---|---|---|
| Type | Identity | I | J | K | L |
| Epoxy | Bisphenol F | 25.75 | 22.27 | 25.75 | 25.75 |
| Polysulfide Toughener | LP-3 | 2.5 | 2.3 | 2.7 | 2.5 |

TABLE 5-continued

| Component | | Composition/(wt. %) | | | |
|---|---|---|---|---|---|
| Type | Identity | I | J | K | L |
| Imidazole | 2PHZ (Solid) | 0.25 | 0.23 | — | — |
| | NXJ-60 (Liquid) | — | — | — | 0.25 |
| Dicyandamide | CG-1400 | 1.5 | 1.2 | 1.75 | 1.5 |
| Silica | SO-E5 | 70 | 74 | 70 | 70 |

Here again, performance is evaluated in terms of capillary flow distance of the liquid composition and Tg of the cured composition, results for which are set forth in Table 6.

TABLE 6

| | Composition | | | |
|---|---|---|---|---|
| Physical Property | I | J | K | L |
| 50 Micron-gap, Flow Distance @ 120° C. | >60 mm | >60 mm | >60 mm | 42 mm |
| Tg | 105° C. | 109° C. | 70° C. | 106° C. |

Compositions I and J illustrate the benefits of including a solid imidazole over a liquid imidazole (Composition K) or no latent curative at all (Composition J).

Compositions I and J have high Tg values and penetrate small gaps for long distances.

The present invention has been illustrated above, though its true spirit and scope is defined by the claims.

What is claimed is:

1. A thermosetting resin composition capable of sealing underfilling between a semiconductor device and a circuit board to which said semiconductor device is electrically connected, said composition comprising:
   (a) an epoxy resin component;
   (b) a latent hardener component comprising
      (i) a modified amide; and
      (ii) a latent catalyst therefor; and
   (c) a polysulfide-based toughening component.

2. The composition of claim 1, wherein the latent catalyst is a solid imidazole.

3. The composition of claim 1, wherein said epoxy resin comprises at least one multifunctional epoxy resin.

4. The composition according to claim 1, wherein the epoxy resin component includes members selected from the group consisting of $C_6$–$C_{28}$ alkyl glycidyl ethers; $C_6$–$C_{28}$ fatty acid glycidyl esters; $C_6$–$C_{28}$ alkylphenol glycidyl ethers; polyglycidyl ethers of pyrocatechol, resorcinol, hydroquinone, 4,4'-dihydroxydiphenyl methane, 4,4'-dihydroxy-3,3'-dimethyldiphenyl methane, 4,4'-dihydroxydiphenyl dimethyl methane, 4,4'-dihydroxydiphenyl methyl methane, 4,4'-dihydroxydiphenyl cyclohexane, 4,4'-dihydroxy-3,3'-dimethyldiphenyl propane, 4,4'-dihydroxydiphenyl sulfone, and tris(4-hydroxyphyenyl)methane; polyglycidyl ethers of the chlorination and bromination products of the above-mentioned diphenols; polyglycidyl ethers of novolacs; polyglycidyl ethers of diphenols obtained by esterifying ethers of diphenols obtained by esterifying salts of an aromatic hydrocarboxylic acid with a dihaloalkane or dihalogen dialkyl ether; polyglycidyl ethers of polyphenols obtained by condensing phenols and long-chain halogen paraffins containing at least two halogen atoms; N,N'-diglycidyl-aniline; N,N'-dimethyl-N,N'-diglycidyl-4,4'-diaminodiphenyl methane; N,N,N',N'-tetraglycidyl-4,4'-diaminodiphenyl methane; N-diglycidyl-4-aminophenyl glycidyl ether; N,N,N',N'-tetraglycidyl-1,3-propylene bis-4-aminobenzoate;

bisphenol A epoxy resin, bisphenol F epoxy resin, phenol novolac epoxy resin, and cresol novolac epoxy resin.

5. The composition according to claim 1, wherein the epoxy resin component includes bisphenol F epoxy resin.

6. The composition according to claim 1, wherein the latent hardener component is employed in an up to about 30 parts, per hundred parts of epoxy resin component.

7. The composition according to claim 1, wherein the modified amide component is employed in an up to about 15 parts, per hundred parts of epoxy resin component.

8. The composition according to claim 1, wherein the latent catalyst is an imidazole selected from the group consisting of imidazole, isoimidazole, 2-methyl imidazole, 2-ethyl-4-methylimidazole, 2,4-dimethylimidazole, butylimidazole, 2-heptadecenyl-4-methylimidazole, 2-undecenylimidazole, 1-vinyl-2-methylimidazole, 2-n-heptadecylimidazole, 2-undecylimidazole, 2-heptadecylimidazole, 2-phenylimidazole, 1-benzyl-2-methylimidazole, 1-propyl-2-methylimidazole, 1-cyanoethyl-2-methylimidazole, 1-cyanoethyl-2-ethyl-4-methylimidazole, 1-cyanoethyl-2-undecylimidazole, 1-cyanoethyl-2-phenylimidazole, 1-guanaminoethyl-2-methylimidazole and addition products of an imidazole methylimidazole and addition products of an imidazole and trimellitic acid, 2-n-heptadecyl-4-methylimidazole, phenylimidazol, benzylimidazole, 2-methyl-4,5-diphenylimidazole, 2,3,5-triphenylimidazole, 2-styrylimidazole, 1-(dodecyl benzyl)-2-methylimidazole, 2-(2-hydroxyl-4-t-butylphenyl)-4,5-diphenylimidazole, 2-(2-methoxyphenyl)-4,5-diphenylimidazole, 2-(3-hydroxyphenyl)-4,5-diphenylimidazole, 2-(p-dimethyl-aminophenyl)-4,5-diphenylimidazole, 2-(2-hydroxyphenyl)-4,5-diphenylimidazole, di(4,5-diphenyl-2-imidazole)-benzene-1,4,2-naphthyl-4,5-diphenylimidazole, 1-benzyl-2-methylimidazole, 2-p-methoxystyrylimidazole, 2-phenyl-4,5-dihydroxymethylimidazole and the combinations thereof.

9. The composition according to claim 1, wherein the latent catalyst is a tertiary amine salt.

10. The composition according to claim 1, wherein the latent catalyst is a member selected from the group consisting of DBU-phenolate, DBU-hexanoate, DBU-formate, and DBU-p-toluenesulfonate.

11. The composition according to claim 1, wherein the latent catalyst is a substituted urea.

12. The composition according to claim 1, wherein the latent catalyst is a member selected from the group consisting of phenyldimethyl urea, toluene bis(dimethyl urea), and methylene diphenyl bis(dimethyl urea).

13. The composition according to claim 1, wherein the polysulfide-based toughening component is a member selected from the group within the formulae consisting of:

HS—(R—SS)$_n$—R—SH and

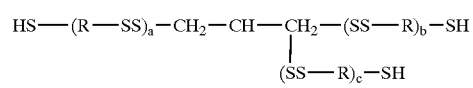

wherein R is an alkyl ether, and a+b+c=n.

14. The composition according to claim 13, wherein the polysulfide-based toughening component is within

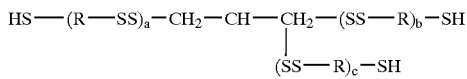

wherein R is —(CH$_2$)$_2$—O—CH$_2$—O—(CH$_2$)$_2$—, n is 6 and the molecular weight is about 1,000.

15. The composition according to claim 1, wherein the polysulfide-based toughening component is employed in an amount up to about 20 parts, per hundred of epoxy resin component.

16. The composition according to claim 1, wherein the polysulfide-based toughener component is employed in an amount within the range of 5 to about 15 parts, per hundred parts of epoxy resin component.

17. The composition according to claim 1, further comprising a transition metal complex is a member selected from the group consisting of

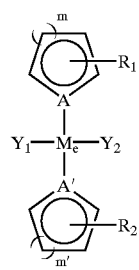

I

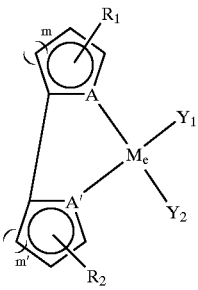

II wherein $R_1$, $R_2$, $Y_1$, $Y_2$, A, A', m, m' and $M_e$ are as defined above;

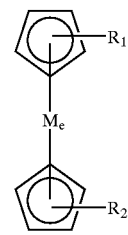

III wherein $R_1$ and $R_2$ may be the same or different and may occur at least once and up to as many four times on each ring in the event of a five-membered ring and up to as many as five times on each ring in the event of a six-membered ring;

$R_1$ and $R_2$ may be selected from H; any straight- or branched-chain alkyl constituent having from 1 to about 8 carbon atoms, such as —CH$_3$, —CH$_2$CH$_3$, —CH$_2$CH$_2$CH$_3$, —CH(CH$_3$)$_2$, —C(CH$_3$)$_3$ or the like; acetyl; vinyl; allyl; hydroxyl; carboxyl; —(CH$_2$)$_n$—OH, wherein n may be an integer in the range of 1 to about 8; —(CH$_2$)$_n$—COOR$_3$, wherein n may be an integer in the range of 1 to about 8 and R$_3$ may be any straight- or branched-chain alkyl constituent having from 1 to about 8 carbon atoms; H; Li; Na; —(CH$_2$)$_n$—OR$_4$, wherein n may be an integer in the range of 1 to about 8 and R$_4$ may be any straight- or branched-chain alkyl constituent having from 1 to about 8 carbon atoms; or —(CH$_2$)$_n$N$^+$(CH$_3$)$_3$ X$^-$, where n may be an integer in the range of 1 to about 8 and X may be Cl$^-$, Br$^-$, I$^-$, ClO$_4^-$ or BF$_4^-$;

$Y_1$ and $Y_2$ may not be present at all, but when at least one is present they may be the same or different and may be selected from H, Cl$^-$, Br$^-$, I$^-$, cyano, methoxy, acetyl, hydroxy, nitro, trialkylamines, triaryamines, trialkylphospines, triphenylamine, tosyl and the like;

A and A' may be the same or different and may be C or N;

m and m' may be the same or different and may be 1 or 2; and $M_e$ is Fe, Ti, Ru, Co, Ni, Cr, Cu, Mn, Pd, Ag, Rh, Pt, Zr, Hf, Nb, V, and Mo;

wherein $R_1$, $R_2$ and $M_e$ are as defined above; and $M_e$[CW$_3$—CO—CH=C(O)—CW'$_3$]$_2$, wherein $M_e$ is as defined above, and W and W' may be the same or different and may be selected from H, and halogens.

18. The composition according to claim 1, further comprising a filler.

19. The composition according to claim 18, wherein the filler is an inorganic filler.

20. The composition according to claim 19, wherein the inorganic filler is a silica filler.

21. The composition according to claim 19, wherein the inorganic filler comprises a nanoparticle-sized silica filler.

22. Reaction products of the composition according to claim 1.

23. A mounting structure for semiconductor devices, comprising:
   a semiconductor device comprising a semiconductor chip mounted on a carrier substrate, and
   a circuit board to which said semiconductor device is electrically connected,
wherein the space between the carrier substrate of said semiconductor device and said circuit board is sealed with a reaction product of the composition according to claim 1.

24. A process for fabricating semiconductor devices, said process comprising the steps of:
   electrically connecting a semiconductor device comprising a semiconductor chip mounted on a carrier substrate, to a circuit board;
   infiltrating a thermosetting resin composition according to claim 1 into the space between the carrier substrate of said semiconductor device and said circuit board; and
   curing the composition by the application of heat.

* * * * *